(12) United States Patent
Amadu et al.

(10) Patent No.: US 9,112,464 B2
(45) Date of Patent: Aug. 18, 2015

(54) METHOD FOR NORMALIZING THE POWER OF A SOUND SIGNAL AND ASSOCIATED PROCESSING DEVICE

(75) Inventors: Frederic Amadu, Chelles (FR); Thomas Esnault, Paris (FR); Alexandre Fenieres, Paris (FR)

(73) Assignee: ARKAMYS, Paris (FR)

( * ) Notice: Subject to any disclaimer, the term of this patent is extended or adjusted under 35 U.S.C. 154(b) by 0 days.

(21) Appl. No.: 14/125,576

(22) PCT Filed: Jun. 18, 2012

(86) PCT No.: PCT/EP2012/061602
§ 371 (c)(1),
(2), (4) Date: Dec. 12, 2013

(87) PCT Pub. No.: WO2012/172109
PCT Pub. Date: Dec. 20, 2012

(65) Prior Publication Data
US 2014/0376746 A1    Dec. 25, 2014

(30) Foreign Application Priority Data
Jun. 17, 2011 (FR) ..................... 11 01868

(51) Int. Cl.
*H03G 3/00* (2006.01)
*H03G 3/30* (2006.01)
*H03G 7/00* (2006.01)

(52) U.S. Cl.
CPC ............... *H03G 3/00* (2013.01); *H03G 3/3005* (2013.01); *H03G 7/007* (2013.01)

(58) Field of Classification Search
CPC ......... H03G 7/002; H03G 9/025; H03G 7/00; H03G 7/007; H03G 3/00; H03G 3/3005; H03G 3/301; H03G 5/00; H03G 5/16; H03G 5/165; H04R 2430/01

USPC ........................ 381/104–109; 704/500, 502
See application file for complete search history.

(56) References Cited

U.S. PATENT DOCUMENTS 5,038,310 A * 8/1991 Akagiri et al. ................. 708/205
7,003,468 B2 * 2/2006 Utsumi ......................... 704/500
(Continued)

FOREIGN PATENT DOCUMENTS

GB         2147165 A      5/1985

OTHER PUBLICATIONS

Vickers et al, "The Loudness War: Background, Speculation, and Recommendations", AES Convention 120, Nov. 4, 2010, AES, New York, USA.
(Continued)

*Primary Examiner* — Vivian Chin
*Assistant Examiner* — Jason R Kurr
(74) *Attorney, Agent, or Firm* — IM IP LAW PLLC; C. Andrew Im

(57) ABSTRACT

A method and device for normalizing the power of an electrical signal, referred to as an original sound signal S1. The method detects the envelope of the original sound signal S1 and compares the power value of the envelope signal S2 with a threshold value K1. The gain signal S3 is calculated in accordance with the comparison and smoothed to obtain a smoothed gain signal S4. The original sound signal S1 is delayed by a delay T. The smoothed gain signal S4 is applied to the delayed original sound signal S1 to obtain a normalized sound signal S5. The method is suitable for a source including a plurality of channels.

10 Claims, 2 Drawing Sheets

(56) References Cited

U.S. PATENT DOCUMENTS

| | | | |
|---|---|---|---|
| 7,242,784 B2 * | 7/2007 | Cranfill et al. | 381/107 |
| 7,848,531 B1 | 12/2010 | Vickers et al. | |
| 8,300,849 B2 * | 10/2012 | Smirnov et al. | 381/106 |
| 8,849,433 B2 * | 9/2014 | Seefeldt et al. | 700/94 |
| 2007/0195975 A1 * | 8/2007 | Cotton et al. | 381/104 |

OTHER PUBLICATIONS

Wolters Martin et al, "Loudness Normalization in the Age of Portable Media Players", AES Convention 128, May 1, 2010, AES New York, USA.

* cited by examiner

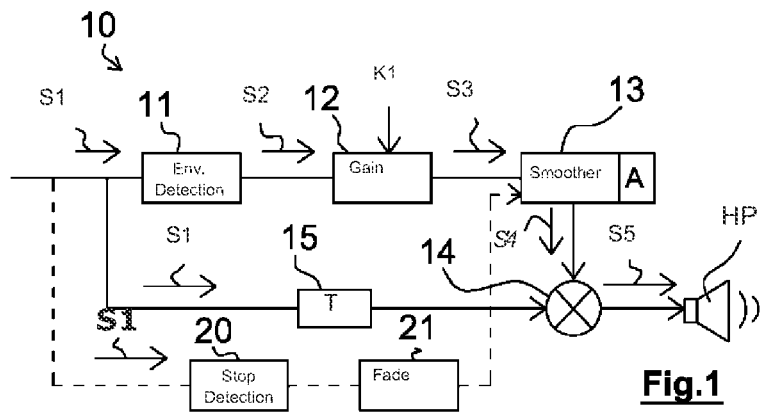
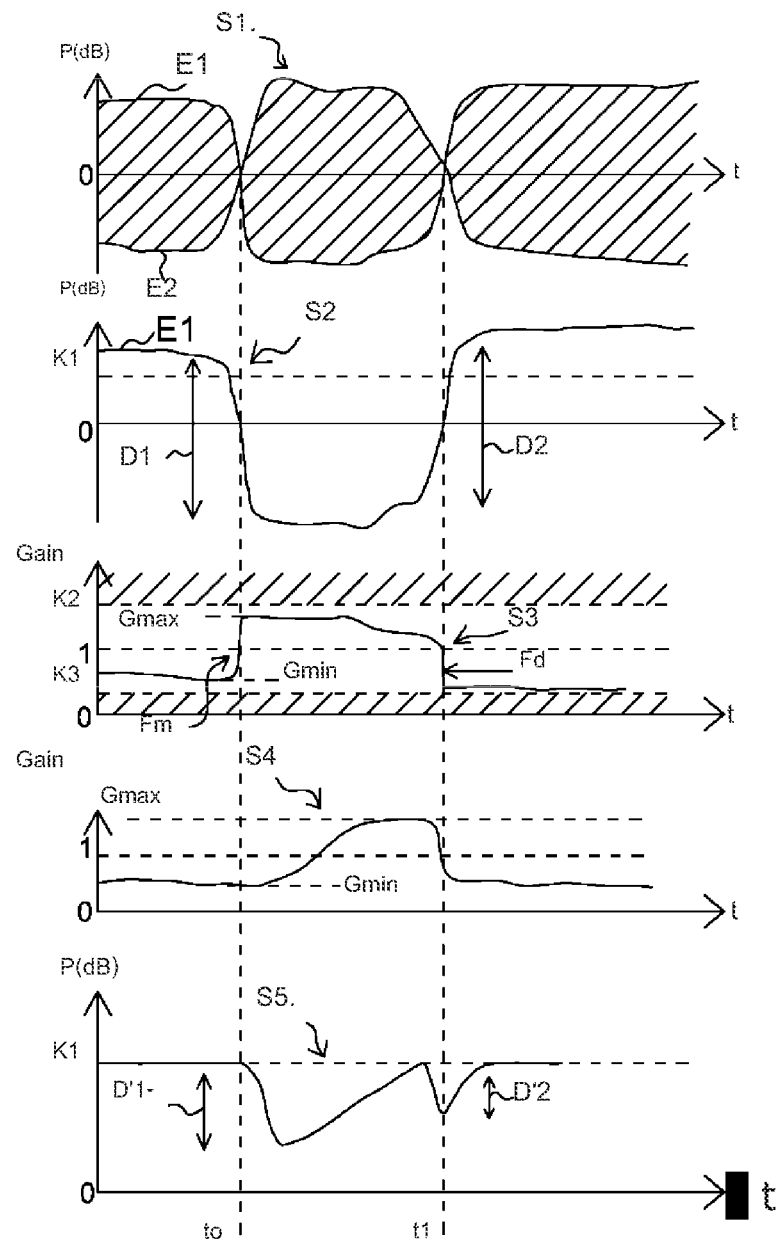
Fig.1
Fig.2

METHOD FOR NORMALIZING THE POWER OF A SOUND SIGNAL AND ASSOCIATED PROCESSING DEVICE

RELATED APPLICATIONS

This application is a §371 application from PCT/EP2012/061602 filed Jun. 18, 2012, which claims priority from French Patent Application No. 1101868 filed Jun. 17, 2011, each of which is herein incorporated by reference in its entirety.

TECHNICAL FIELD OF THE INVENTION

This invention relates to a method for normalizing the level of a sound signal, as well as the associated processing device.

The invention has a particularly advantageous application in the domain of audio playback devices, such as digital televisions, car radios, and MP3 players.

PRIOR ART

Sound signals broadcasted by such audio playback devices exhibit variations in average power, either because they come from different sources (different radio channels, different readings) that each exhibit different qualities or because the source itself issues a signal whose quality varies over time.

Therefore, when the signal is broadcasted by the playback device and amplified according to a static gain, the listener perceives a sound with a variable volume, which is unpleasant to the ear.

To solve this problem, the methods of the prior art consist of adjusting the power of the signal so that the average power of the broadcasted sound is constant. As such, a variable gain is applied to the sound signal such as it is emitted by the source, called an original sound signal.

However, these methods of the prior art do not comply with the original dynamic of the sound signal, meaning that no sound depth is perceived by the listener in the sound that is ultimately broadcasted.

OBJECT AND SUMMARY OF THE INVENTION

The invention aims to overcome this drawback and relates as such to a method for normalizing the power of an electrical signal, called an original sound signal, such method comprising the steps of:
  detecting the envelope of the original sound signal so as to obtain an envelope signal,
  comparing the power value of the envelope signal with a threshold value,
  calculating a gain signal in accordance with this comparison,
  smoothing the gain signal so as to obtain a smoothed gain signal,
  delaying the original sound signal by a delay so as to obtain a delayed original sound signal, and
  applying the smoothed gain signal to the delayed original sound signal such that a normalized sound signal having a power close to the threshold value is obtained.

Thus, the broadcasted sound is normalized while maintaining the sound depth of the original sound signal.

The method that is the purpose of the invention can be implemented according to the advantageous embodiments presented below, which can be considered individually or according to any technically operative combination.

According to one advantageous embodiment, because a plurality of channels are each associated with an original sound signal, the method of the invention comprises the steps of:
  recording the minimum value of the smoothed gain signal applied to the delayed original sound signal of the current channel during a channel change so as to be able to reload it later,
  the value of the gain signal applied on the delayed original sound signal of the channel being equal, during a new channel selection, to the sum of the minimum value of the previously recorded gain signal, said static value, and a dynamic gain value,
  the value of the dynamic gain signal being calculated from the comparison between the power value of the envelope signal of the channel minus the power corresponding to the static gain and the threshold value.

Advantageously, to obtain the smoothed gain signal, the method of the invention comprises the step of integrating the gain signal on a rising edge over a longer duration than the duration on which the gain signal is integrated on a falling edge.

Advantageously, to obtain the smoothed gain signal, the gain signal and the smoothed gain signal being sampled,
  the smoothed gain value of row n is based on the smoothed gain value of row n−1 and the difference between the current gain value of row n and the smoothed gain value of row n−1 weighted by a smoothing value,
  said smoothing value being close to 1 if the current gain value is less than the previous smoothed gain value,
  said smoothing value being close to 0 if the current gain value is less than the previous smoothed gain value.

Advantageously, the method of the invention comprises the steps of:
  detecting when the power of the original sound signal is less than a threshold value during a threshold duration, called a stop duration,
  gradually reducing the smoothed gain signal from the end of the stop duration until the unit gain value,
  so as to create a gradual natural stop effect of the original sound signal.

Advantageously, the smoothed gain signal is reduced according to a decreasing exponential function.

The method of the invention comprises, according to one advantageous embodiment, a step consisting of limiting the values of the gain signal that are higher than a threshold, called an upper limit threshold, to this upper limit threshold.

According to one advantageous embodiment of the method of the invention, it comprises a step consisting of limiting the values of the gain signal that are below a threshold, called a lower limit threshold, to this lower limit threshold.

Advantageously, the threshold value can be modified by a user.

According to one embodiment of the method of the invention, the delay applied to the original sound signal is between 2 and 3 milliseconds.

The invention further relates to a processing device comprising means for implementing the method of the invention according to any one of these embodiments.

BRIEF DESCRIPTION OF THE DRAWINGS

The invention is described below according to, but not limited to, its preferred embodiments and in reference to FIGS. 1 to 3, which show:

FIG. 1: a block diagram of the sound processing device according to the invention in the form of functional blocks;

FIG. 2: a time-based graphical illustration of the signals obtained as output from the functional blocks of the device in FIG. 1 during the steps leading to the limitation of power of the original sound signal;

Figure 3:
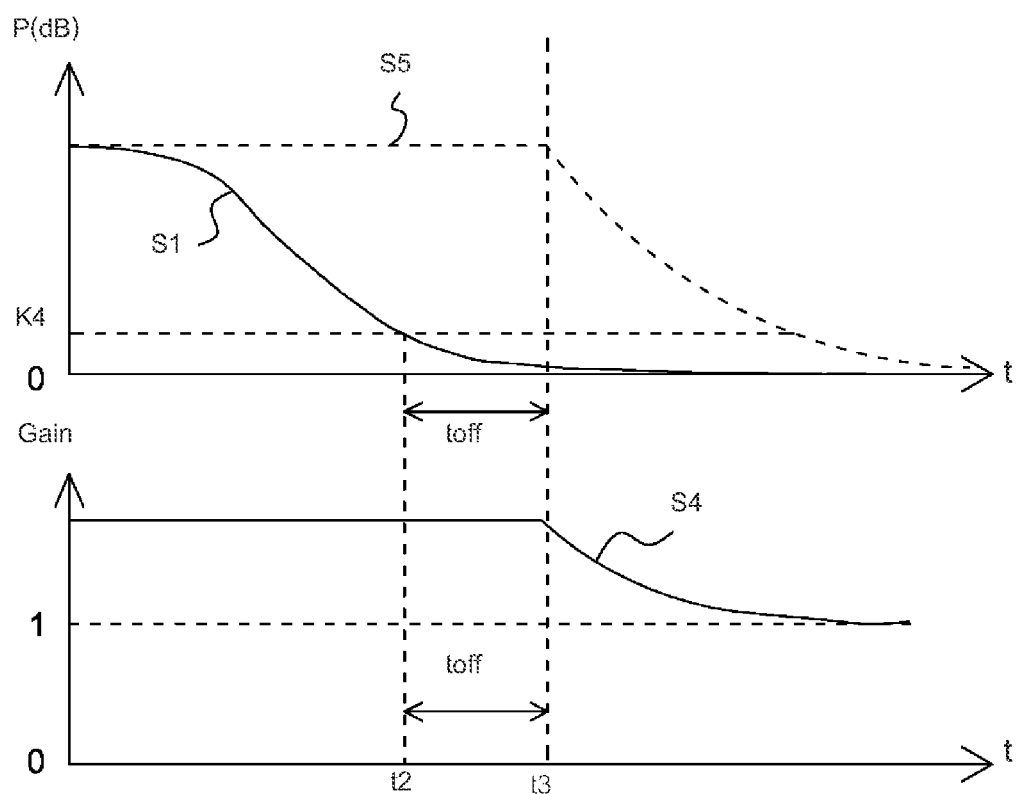
FIG. 3: time-based graphical illustrations of the signals from the functional blocks of the device in FIG. 1 during the steps leading to a gradual reduction of the original sound signal.

Identical, similar, or analogous elements keep the same reference from one figure to another.

DETAILED DESCRIPTION OF THE EMBODIMENTS

FIG. 1 shows a processing device 10 according to the invention capable of normalizing the power of an original sound signal. This processing device 10 can be integrated, by example, within a digital television, car radio, or MP3 player This device 10 comprises an envelope detection module 11, a gain calculation module 12, and a gain smoothing module 13. A combination module 14 and a delay module 15 allow the smoothed gain signal obtained as output from the module 13 to be applied on the delayed original sound signal with a delay T.

FIG. 2 shows the change over time of the power of the signals S1, S2, S5 corresponding respectively to the original sound signal, the signal obtained as output from module 11, and the signal obtained as output from module 14. FIG. 2 also shows the change over time of the gain value of the signals S3 and S4 obtained respectively as output from modules 12 and 13.

More specifically, the module 11 detects the envelope of the original sound signal S1 applied to one of its inputs and generates the envelope signal S2. The module 11 preferably detects only a portion E1 of the envelope of the signal S1, the other portion E2 being opposite E1.

The module 12 compares the gain value of the envelope signal S2 with a threshold value K1. Preferably, the threshold value K1 between −6 and −12 dB can be modified by the user. The module 12 then calculates a gain signal S3 based on this comparison. The gain signal S3 has such values when the gain signal S3 is applied to the original sound signal S1, and the obtained signal has a power that is substantially equal to the threshold value K1 selected by the user.

Preferably, the module 12 limits the values of the gain signal S3 that are greater than a threshold K2, called an upper limit threshold, to that upper limit threshold. Preferably, the module 12 also limits the values of the gain signal S3 that are below a threshold K3, called a lower limit threshold, to that lower limit threshold. In an example embodiment, the upper limit threshold K2 and the lower limit threshold K3 are respectively approximately 45 dB.

The module 13 then carries out smoothing of the gain signal S3. As such, the module 13 integrates the gain signal S3 over a rising edge Fm over a longer duration than the duration on which the gain signal S3 is integrated on a falling edge Fd. A rising edge Fm can be observed when the gain signal S3 changes from a value below a unit gain to a value above the unit gain. Conversely, a falling edge Fd can be observed when the gain signal S3 changes from a value above a unit gain to a value below the unit gain.

More specifically, because the gain signal S3 and the smoothed gain signal S4 have been sampled in advance, each sample has a given row corresponding to the instant at which it was obtained.

Under these conditions, the smoothed gain value in row n (smooth(n)) obtained as output from the smoothing module 13 is based on the smoothed gain value in row n−1 (smooth(n−1)) and the difference between the current gain value in row n (current(n)) and the smoothed gain value in row n−1 (smooth(n−1)) weighted by a smoothing value A that is between 0 and 1.

According to an example embodiment, the smoothed gain value of row n (smooth(n)) obtained as output from the module 13 is equal to:

$$\text{Smooth}(n) = \text{smooth}(n-1) + [(\text{current}(n) - \text{smooth}(n-1)) \times A]$$

the smoothing value A being close to 1 if the current gain value (current(n)) is less than the previous smoothed gain value (smooth(n−1)) on a falling edge of the signal. According to an example embodiment, the smoothing value A is between 0.90 and 0.98.

the smoothing value A being close to 0 if the current gain value (current(n)) is greater than the previous smoothed gain value (smooth(n−1)) on a rising edge of the signal. According to an example embodiment, the smoothing value A is then between 0.00001 and 0.00002.

FIG. 2 shows the smoothed gain signal S4 obtained as output from the module 13. Thus, for a rising edge Fm of the unsmoothed gain (signal S3), the gain slowly increases to the target value, Gmax, to be reached. However, for a falling edge Fd of the unsmoothed gain, the gain quickly falls to the target value, Gmin, to be reached.

However, the module 15 delays the original sound signal S1 by a delay T. This delay T corresponds to the time needed by the device 10 of the invention, to develop the smoothed gain signal S4. The delay T is, for example, between 2 and 3 milliseconds.

The combination module 14 makes it possible to apply the smoothed gain signal to the delayed original sound signal S1 so as to obtain a normalized sound signal S5 having a power close to the threshold value K1.

Thus, the variations D1, D2 in sound level that existed in the original sound signal S1 are kept in the normalized sound signal S5 (see the corresponding variations D1' and D2'), while the power of the normalized signal S5 does not exceed the threshold power limit value K1.

In other words, the invention makes it possible to keep the sound depth of the original sound signal S1.

The method of the invention also makes it possible to gradually decrease the power of the original sound signal S1 when the power of the original sound signal is less than a threshold during a threshold duration.

As such, a module 20 detects when the power of the original sound signal S1 is less than a threshold value K4 during a duration Toff, called the stop duration, which the elapsed time between instants t2 and t3, FIG. 3. According to an example embodiment, the threshold value K4 is approximately −60 dB, and the stop duration Toff is around 2,000 milliseconds.

A module 21 then gradually decreases the smoothed gain signal S4 which is close to its maximum level, from the end of the stop duration Toff at instant t3, to a gain value equal to 1. This has an effect of gradually decreasing the power of the signal S5 to be broadcasted, which thus followed the change in the original sound signal S1. According to one embodiment, the gain in the signal S4 decreases according to a decreasing exponential function.

The invention therefore makes it possible to create a gradual natural stop effect in the original sound signal (a sound effected known as "fade"), which is commonly found at the end of a piece of music.

The invention is advantageously implemented with a plurality of channels (TV channels, radio stations, etc.), each associated with at least one original sound signal.

In this case, the minimum gain is recorded during a channel change. Thus, if at the instant ti, a user selects a first channel, and at the instant tj, the user changes the channel, the minimum gain calculated for the period between ti and tj for the first channel is stored in a memory. This gain is reloaded when the same first channel is again selected by the user. Thus, the minimum gain to be applied is stored for each channel.

The global gain applied over the signal(s) of a channel is then equal to the sum of a static gain preferably corresponding to the previously recorded minimum gain value and a dynamic gain obtained according to the method described above. The minimum gain value is regularly updated if it corresponds to the minimum gain value of the previous session, or fixed after having been calculated during a first session. The term "session" here means the selection of a channel by the user over a given time period that ends when the user changes the channel.

More specifically, in this case, the dynamic gain signal is calculated from the comparison between the signal S2 from which a power corresponding to the static gain and the threshold value K1 are previously subtracted. As previously explained, this dynamic gain signal is smoothed to then be applied over the delayed original sound signal to obtain a normalized sound signal having a power close to the threshold value K1.

Thus, the variations in gain are lower, and the dynamic of the original sound signal is fully maintained.

The invention claimed is:

1. A method for normalizing a power of an electrical signal or original sound signal, each of a plurality of channels being associated with an original sound signal, the method comprising the steps of:
   detecting an envelope of the original sound signal to obtain an envelope signal;
   comparing a power value of the envelope signal with a first threshold value to provide a comparison;
   calculating a gain signal in accordance with the comparison;
   smoothing the gain signal to obtain a smoothed gain signal;
   delaying the original sound signal by a delay to obtain a delayed original sound signal;
   saving a minimum value of the smoothed gain signal applied to the delayed original sound signal of a current channel during a channel change;
   wherein a value of the smoothed gain signal applied to the delayed original sound signal being equal, when a new channel is selected, to a sum of a dynamic gain value and a previously recorded minimum value of the smoothed gain signal or a static value;
   calculating the dynamic gain value from the comparison between the power value of the envelope signal of the channel subtracted from the power corresponding to the static value and the first threshold value; and
   applying the smoothed gain signal to the delayed original sound signal to obtain a normalized sound signal having a power close to the threshold value.

2. The method according to claim 1, wherein the step of smoothing comprises the step of integrating the gain signal over a rising edge over a duration greater than the duration over which the gain signal is integrated on a falling edge.

3. The method according claim 1, wherein the step of smoothing comprises the steps of sampling the gain signal and the smoothed gain signal; and
determining a smoothed gain value of row n (smooth(n)) based on the smoothed gain value of row n−1 (smooth(n−1)) and a difference between a current gain value of row n and the smoothed gain value of row n−1 weighted by a smoothing value, wherein the smoothing value being close to 1 if the current gain value is less than a previous smoothed gain value (smooth(n−1)) and wherein the smoothing value being close to 0 if the current gain value is less than the previous smoothed gain value.

4. The method according claim 1, further comprising the steps of:
   detecting when the power value of the original sound signal is less than a second threshold value during a threshold duration or a stop duration; and
   gradually reducing the smoothed gain signal from an end of the stop duration until a unit gain value to create a gradual natural stop effect of the original sound signal.

5. The method according to claim 4, further comprising the step of reducing the smoothed gain signal according to a decreasing exponential function.

6. The method according to claim 1, further comprising the step of limiting values of the gain signal that are higher than an upper limit threshold to the upper limit threshold.

7. The method according to claim 1, further comprising the step of limiting values of the gain signal that are below a lower limit threshold to the lower limit threshold.

8. The method according to claim 1, further comprising the step of modifying the threshold value by a user.

9. The method according to one of claim 1, further comprising the step of delaying the original sound signal by the delay which is between 2 and 3 milliseconds.

10. A processing device for normalizing a power of an electrical signal or original sound signal, each of a plurality of channels being associated with an original sound signal, comprising:
   a detection module to detect an envelope of the original sound signal to obtain an envelope signal;
   a delay module to delay the original sound signal by a delay to obtain a delayed original sound signal;
   a gain calculation module to:
      compare a power value of the envelope signal to a first threshold value to provide a comparison;
      calculate a gain signal in accordance with the comparison; and
      calculate a dynamic gain value from the comparison between the power value of the envelope signal of a channel subtracted from a power corresponding to a static value and the first threshold value;
   a gain smoothing module to:
      smooth the gain signal to obtain a smoothed gain signal; and
      save a minimum value of the smoothed gain signal applied to the delayed
   original sound signal of a current channel during a channel change;
   a combination module to apply the smoothed gain signal to the delayed original sound signal to obtain a normalized sound signal having a power close to the threshold value; and
   wherein a value of the smoothed gain signal applied to the delayed original sound signal being equal, when a new channel is selected, to a sum of a dynamic gain value and a previously recorded minimum value of the smoothed gain signal or the static value.

* * * * *